(12) United States Patent
Honda

(10) Patent No.: US 8,085,078 B2
(45) Date of Patent: Dec. 27, 2011

(54) LEVEL SHIFT CIRCUIT

(75) Inventor: Yuri Honda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/588,689

(22) Filed: Oct. 23, 2009

(65) Prior Publication Data

US 2010/0109742 A1 May 6, 2010

(30) Foreign Application Priority Data

Oct. 31, 2008 (JP) ................. 2008-281411

(51) Int. Cl.
*H03L 5/00* (2006.01)
(52) U.S. Cl. ............... 327/333; 326/62; 326/81
(58) Field of Classification Search ........... 326/62–63, 326/80–82; 327/306, 333
See application file for complete search history.

(56) References Cited

U.S. PATENT DOCUMENTS

| 6,316,971 B1 | 11/2001 | Ohashi | |
| 6,359,494 B2 * | 3/2002 | Kanda et al. | 327/333 |
| 7,239,182 B2 * | 7/2007 | Fukazawa et al. | 326/83 |
| 7,274,218 B2 * | 9/2007 | Sommer | 326/83 |
| 7,560,972 B1 * | 7/2009 | Tiew et al. | 327/333 |

FOREIGN PATENT DOCUMENTS

| JP | 2953006 | 7/1999 |
| JP | 3319406 | 6/2002 |

* cited by examiner

*Primary Examiner* — Dinh T. Le
(74) *Attorney, Agent, or Firm* — McGinn Intellectual Property Law Group, PLLC

(57) ABSTRACT

A level shift circuit includes a first resistor with one end connected to GND, a first transistor with a drain and a gate connected to the other end of the first resistor, and a source connected to a first power supply, a second transistor with a source connected to the first power supply, and a gate connected to the drain and the gate of the first transistor, a second resistor with one end connected to a drain of the second transistor, a third transistor with a source connected to the other end of the second resistor, and a gate connected to an input terminal, a first current source connected between a second power supply and a drain of the third transistor; and a fourth transistor connected between an output terminal and the first power supply with a gate connected to the drain of the second transistor.

14 Claims, 15 Drawing Sheets

LEVEL SHIFT CIRCUIT

REFERENCE TO RELATED APPLICATION

This application is based upon and claims the benefit of the priority of Japanese patent application No. 2008-281411, filed on Oct. 31, 2008, the disclosure of which is incorporated herein in its entirety by reference thereto.

The present invention relates to a level shift circuit, and in particular, to a circuit configuration that may be applied suitably to a level shift circuit in which, among power supplies, a lowest power supply voltage level can be varied.

TECHNICAL FIELD

Background

In a digital communication apparatus, as a switch that selects one of a transmission terminal which receives a signal to be transmitted, and a reception terminal, from which a reception signal is outputted, to connect a selected terminal to an antenna terminal, from a viewpoint of low electric power and small size, a switch that makes use of an FET (Field Effect Transistor), in particular, a switch that makes use of an FET on a GaAs-substrate is used.

With the switch that uses an FET, when the level of a signal received at an input terminal of the switch is high, a potential difference between a source and a gate, of the FET and a potential difference between a drain and the gate of the FET must be made large. Empirically, with regard to this potential difference, a 2.7V regulated power supply voltage of a mobile telephone is not sufficient, and it is necessary to use a voltage boosted by a DC-DC converter or the like.

A voltage close to a higher voltage out of voltages applied to a gate of an FFT is applied to an input terminal and an output terminal of a switch making use of the FET on a GaAs substrate, in order to turn on/off the FET. For example, a GND potential is applied to a gate of an FET which is to be turn on, while a negative voltage is applied to a gate of an FET which is to be turned off, and hence it is possible to make potentials of the input terminal and the output terminal of the switch become close to GND.

Since there is a possibility of affecting properties of other components connected to the switch, it is important to make the potentials of the input terminal and the output terminal of the switch close to GND as described above, or fixed to GND.

There are two methods of implementing a DC-DC converter: implementing the DC-DC converter on a CMOS (Complementary MOS), and implementing the DC-DC converter on a GaAs. In the following, a description is given concerning the implementation on a GaAs.

A booster circuit or an oscillator composing a DC-DC converter can be implemented by using a GND potential and a regulated voltage. An output voltage of the booster circuit is assumed to be CPOUT (a voltage of an output terminal CPOUT that is connected to an output of a charge pump (CP) of the booster circuit). In a DC-DC converter where small size is considered important for mounting on a switch for a mobile telephone or the like, it is difficult to have a capacitance value (start up capacitor $C_{CPOUT}$) connected to the output terminal CPOUT of the booster circuit, for example, sufficiently large. Consequently, when current flowing from the booster circuit increases, the output voltage CPOUT decreases monotonically.

In turning on/off an FET (GaAs FET) constituting a switch, by using the output voltage CPOUT of the booster circuit, it is necessary to change over a gate potential of the FET. As a result, in a succeeding stage of the booster circuit, a level shift circuit that changes a level of the output voltage is connected. The level shift circuit uses a regulated voltage or a GND potential as a positive power supply, and uses the output voltage CPOUT of the booster circuit as a negative power supply. The level shift circuit receives at an input terminal thereof a High/Low signal between GND and VDD and outputs at an output terminal thereof, a power supply voltage VDD as a High voltage and the output voltage CPOUT of the booster circuit as a Low voltage.

In general, two types of FETs can normally be used on a GaAs substrate: an enhancement mode N-channel FET, and a depletion mode N-channel FET. The N-channel FET (abbreviated as NFET) is controlled to be turned on/off by a gate potential thereof, with a source potential thereof as a reference.

When the output voltage (CPOUT) of the booster circuit is used as the source potential of the NFET in the level shift circuit that performs level shifting of the output voltage of the booster circuit, the voltage (CPOUT) which varies depending on a driving current value from the booster circuit serves as a reference voltage.

[Patent Document 1] Japanese Patent No. 2953006 (JP Patent Kokai Publication No. JP-A-4-124912) (FIG. 1)

[Patent Document 2] Japanese Patent No. 3319406 (JP Patent Kokai Publication No. JP-P2000-101403A) (FIG. 1)

The entire disclosures of Patent Documents 1 and 2 are incorporated herein by reference thereto. The following is an analysis by the present invention.

There is a problem in that, when the level shift circuit is configured to have a power supply voltage, whose value is varied depending on a supply current value, as a lowest level power supply voltage, an input voltage range changes in accordance with the value of the power supply voltage which is varied. This problem will now be described.

FIG. 2 shows the level shift circuit in a case where only a depletion N-channel FET can be used (FIG. 1 of Patent Document 1). In FIG. 2, an input level shift circuit section 11 performs level shifting on an input signal IN (ECL level), a voltage (High/Low=−1.6V/−2.7V) of a drain node N101 of an FET Q102 is supplied to a gate of one FET Q105 of a differential pair of a differential circuit section 12; in the differential circuit section 12, difference voltage between a reference voltage VREF and voltage of the node N101 is amplified, level shifting is performed to change to a BFL (Buffered FET Logic) level, and an output signal N104 of the differential circuit section 12 is received by a BFL circuit section 13.

In the input level shift circuit section 11, if each anode-to-cathode potential difference of diodes D101 to D104 is VF, a voltage V (N101) of the node N101 becomes VIN−4VF.

In the differential circuit section 12, if a voltage V (N101) is greater than the reference voltage VREF, an FET Q106 is off, with a voltage V (N102) of the node N102≅(approximately equal to) GND.

If the potential V (N101) of the node N101 is smaller than VREF, the FET Q106 is turned on, and the voltage V (N102) of the node N102 is approximately equal to Vs (Q105). At this time, the node N102 is clamped to a power supply voltage VSS (=−2.0V) by a current flowing through an FET Q115 to the node N102 from the power supply VSS, and a potential of a node N103 does not rise above gate-to-drain voltage (VF) of an FET Q114 to the power supply voltage VSS from the node N103.

A threshold of V (N102) for an input signal VIN is, by

VIN−4VF=VREF,

VIN=VREF+4VF.

In this expression, since there is no parameter related to a negative power supply voltage VEE (=−5.2V), the threshold for the input signal VIN of V (N102) does not depend on VEE.

In FIG. 2, by shorting the diodes D101 to D104 to change GND to VDD, and having VREF=0V (GND) and VEE=CPOUT, High/Low switching of a potential of an output terminal (here, V (N102)), with an input voltage range GND to VDD, is made possible.

However, in this case, regarding the voltage V (N102) of the node N102, $V(N102)(Low) \cong GND$, and $V(N102)(High) \cong VDD$, and it is not possible to obtain a targeted Low voltage V (Low)=CPOUT.

FIG. 3 shows a simulation result of potential of the node N102 of FIG. 2, with VREF=0V (GND) and VEE=CPOUT, in the configuration of FIG. 2. FIG. 4 shows a simulation result of a source voltage Vs_Q105 of the FET Q105 for the input voltage VIN. The simulation was carried out by the present inventor. The simulation was carried with VDD=3.0V, CPOUT=−7 to −11V (2V step, that is, CPOUT=−7V, −9V, −11V), and VIN=−3 to 3V.

In FIG. 2, in the differential circuit section 12, further level shifting is performed on the potential of the node N102 and is, outputted as a signal of the node N104. The signal of the node N104 is supplied to the BFL circuit section 13 (BFL inverter) and level-shifted. On this occasion, by using a negative power supply voltage VSS (=−2.0V) (>VEE=−5.2V), OUT1 (Low)=VSS−2VF is realized, and a reference power supply for VSS is necessary.

However, it is difficult to generate this reference power supply for VSS by the output voltage (negative power supply voltage) CPOUT of the booster circuit, wherein the value of CPOUT changes depending a load current value.

In order to solve this problem, consideration is given to using a circuit configuration (FIG. 1 in Patent Document 2) as shown in FIG. 5 (the analysis below is given by the present inventor). It is assumed that in FIG. 5, an input terminal 10 is connected to GND, an input terminal 11 is VIN, minus-side potential of a power supply voltage 1 is CPOUT (output voltage of booster circuit), and a plus-side potential is VDD. It is noted that in FIG. 5 (PATENT DOCUMENT 2) and in FIG. 2 (PATENT DOCUMENT 1), there is overlapping with reference numbers 11 and 12, but these are different items.

If a current value (drain current of an NFET 4 in a saturation region) flowing in a first current path formed of an enhancement mode NFET 2, a resistor 3, and the NFET 4 is IREF1, $$IREF1 = \frac{\beta}{2}(V_{GS} - V_T)^2$$

where VGS is gate-to-source voltage of the FET 4, VT is a threshold, and β is a gain coefficient given by:

$$\beta = \frac{C_{OX}}{\mu_n}\left(\frac{W}{L}\right)$$

where μn is an electron mobility, Cox is a capacitance of a gate insulation film per unit area, W is a gate width, and L is a gate length L. Form the above equation, $V_{GS}$ is given by:

$$V_{GS} = V_T + \sqrt{\frac{2IREF1}{\beta}}$$

From CPOUT+VGS+IREF1×R3=0, IREF1 is represented by the following expression.

$$IREF1 = \frac{0 - \left[V_T + \sqrt{\frac{2IREF1}{\beta}}\right] - CPOUT}{R3}$$

Assuming that β is sufficiently, large, IREF1 is given by:

$$IREF1 = \frac{-V_T - CPOUT}{R3} \quad (1)$$

If NFET 4 and NFET 7 form an ideal current mirror, a current flowing in a second current path of NFET 5, a resistor R6 and an NFET 7, is IREF2=IREF1, a gate potential Vg (NFET 9) of NFET 9 is given as VIN−R6×IREF1 obtained by subtracting a voltage drop of the resistor R6 from the voltage VIN of terminal 11, and is given as follows from the above expression (1).

$$V_g(NFET9) = VIN - \frac{R6}{R3}(-V_T - CPOUT) \quad (2)$$

A threshold VT for VIN of the NFET 9 is $$V_g(NFET9) - CPOUT = V_T \quad (3)$$

$$VIN - \frac{R6}{R3}(-V_T - CPOUT) = V_T$$

If R6=R3 in the equation (3),

VIN=0  (4)

This is a threshold, and does not depend on CPOUT.

A potential V_N12 of an output terminal 12 is given as follows:

V_N12(Low)=CPOUT

V_N12(High)=VDD

Thus, it is possible to obtain a desired voltage of the output terminal 12.

A simulation result with VDD=3V, VIN=−3 to 3V, CPOUT=−9 to −5V (2V step), and R3=R6=50 kohm, is shown in FIG. 6 to FIG. 10 (a series of simulations were carried out by the present inventor).

FIG. 6 is a graph showing an input-output characteristic of input voltage VIN and V_N12 (voltage of the output terminal 12 of FIG. 5), for CPOUT=−5V, −7V, and −9V. FIG. 7 is a graph showing a characteristic of input voltage VIN and Vg_N9 (gate-to-source potential of the NFET 9), for CPOUT=−5V, −7V, and −9V. FIG. 8 is a graph showing a characteristic of input voltage VIN and the current value IREF1 (drain current of the FET 4) flowing in the first current path, and the current value IREF2 (drain current of the FET 9) flowing in the second current path, for CPOUT=−5V, −7V, and −9V. FIG. 9 is a graph showing a characteristic of input voltage VIN and Vg_N9 (gate-to-source potential of the NFET 9) for CPOUT=−5V. FIG. 10 is a simulation result of a characteristic of input voltage VIN and Vg_N9 (gate-to-source potential of the NFET 9) for CPOUT=−9V.

With operation according to the theoretical expressions described above, operation of the NFET 9 is turned on and off, without regard to the value of CPOUT. As a result thereof, with the potential of V_N12 (refer to FIG. 6), as in expression (4), VIN=0V, the potential V_N12 of the output terminal 12 should switch between High and Low.

However, in the input-output characteristic of FIG. 6, the input voltage VIN, with High/Low of the potential of V_N12 of the output terminal switching, is approximately 0.4V when CPOUT=−5V,
approximately −0.5V when CPOUT=−7V, and
approximately −1.0V when CPOUT=−9V,
and it is dependent on the value of CPOUT.

In FIG. 8, comparing IREF1 and IREF2, the NFET 4 and the NFET 7 should theoretically operate as a current mirror, but in actuality, it is understood that only at VIN=0V, the same as the potential of the terminal 10 of the first current path composed by the enhancement NFET 2, the resistor 3, and the NFET 4,

IREF1=IREF2 and otherwise, a current mirror is not realized.

If the gate potential Vg_N9 of the NFET 9 is according to the theoretical expression:

$$V_g(NFET9) = VIN - \frac{R6}{R3}(-VT - CPOUT) \qquad (6)$$

it is directly proportional to the input voltage VIN, but in actuality, is related as shown in FIG. 7.

In FIG. 5, focusing only on/off operation of the NFET 9, what is important is the gate-to-source voltage Vg_N9 of the NFET 9. FIG. 9 and FIG. 10 show a VIN−Vg_N9 characteristic for CPOUT=−5V and CPOUT=−9V.

As shown in FIG. 9, with CPOUT=−5V, for VIN=0V, the gate-to-source voltage Vg_N9 of the NFET 9 is 0.20V.

As shown in FIG. 10, with CPOUT=−9V, for VIN=0V, it is understood that the gate-to-source voltage Vg_N9 of the NFET 9 is approximately 0.25V.

This is due to the fact that when the value of the current IREF1 that flows in the first current path becomes large, drain-to-source voltage of the NFET 4 becomes large.

Here, assuming that an NFET threshold is 0.2V, with CPOUT=−5V, there is a threshold at VIN=0V, and with CPOUT=−9V, there is a threshold at VIN=−0.6V.

As a result, the threshold for VIN of an on/off operation of the NFET9 depends on the value of CPOUT.

In actuality, in an output circuit including a depletion mode NFET 8 and an enhancement mode NFET 9, shown in FIG. 5, as the value of the voltage CPOUT becomes smaller, there is a tendency for the threshold with regard to the gate potential Vg_N9 of the NFET 9 of the output terminal voltage V_N12 to become low. This depends on the fact that, in a state of VIN=0V, the drain-to-source voltage of the enhancement mode NFET 9 increases as the voltage CPOUT become lower, and as a result, for a small gate-to-source potential difference of the NFET 9, in comparison to a case where the CPOUT is high, it is possible to obtain the same current value (drain current).

SUMMARY

Accordingly, it is an object of the present invention to provide a circuit that can inhibit an input voltage range from varying in accordance with a power supply voltage value, in a case where the power supply voltage, which can be varied depending on a value of a supply current, is used as a lowest level power supply voltage.

According to the present invention, there is provided a level shift circuit that includes: a first resistor having one end connected to ground, a first transistor having a drain and gate connected to other end of the first resistor, and a source connected to a first power supply, a second transistor having a source connected to the first power supply, and a gate connected to the drain and the gate of the first transistor, a second resistor having one end connected to a drain of the second transistor, a third transistor having a source connected to other end of the second resistor, and a gate connected to an input terminal, a first current source connected between a second power supply and a drain of the third transistor, and an output stage circuit including a fourth transistor having a gate connected to the drain of the second transistor, a fourth transistor connected between an output terminal and the first power supply.

In the present invention, the first current source includes a fifth transistor having a drain connected to the second power supply, and a third resistor connected between a source and a gate of the fifth transistor, wherein a connection node of the gate of the fifth transistor and the third resistor is connected to the drain of the third transistor.

According to the present invention, it is possible to inhibit an input voltage range from varying together with a variable power supply voltage value, in a case where the power supply voltage, which can be varied according to a value of a supplied current, is a lowest level power supply voltage.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
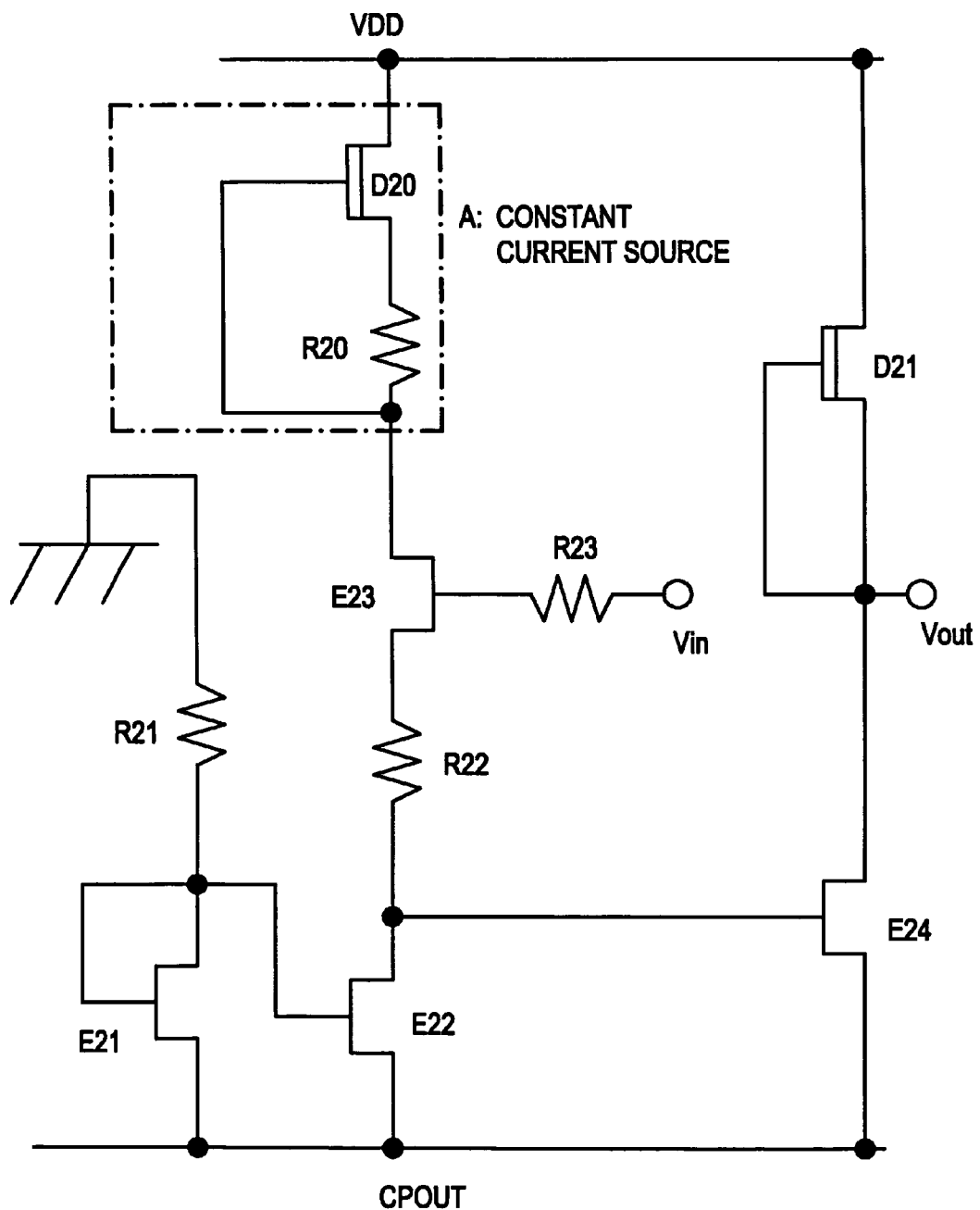
FIG. 1 is a diagram showing a configuration of a first exemplary embodiment of the present invention by an equivalent circuit.
Figure 2:
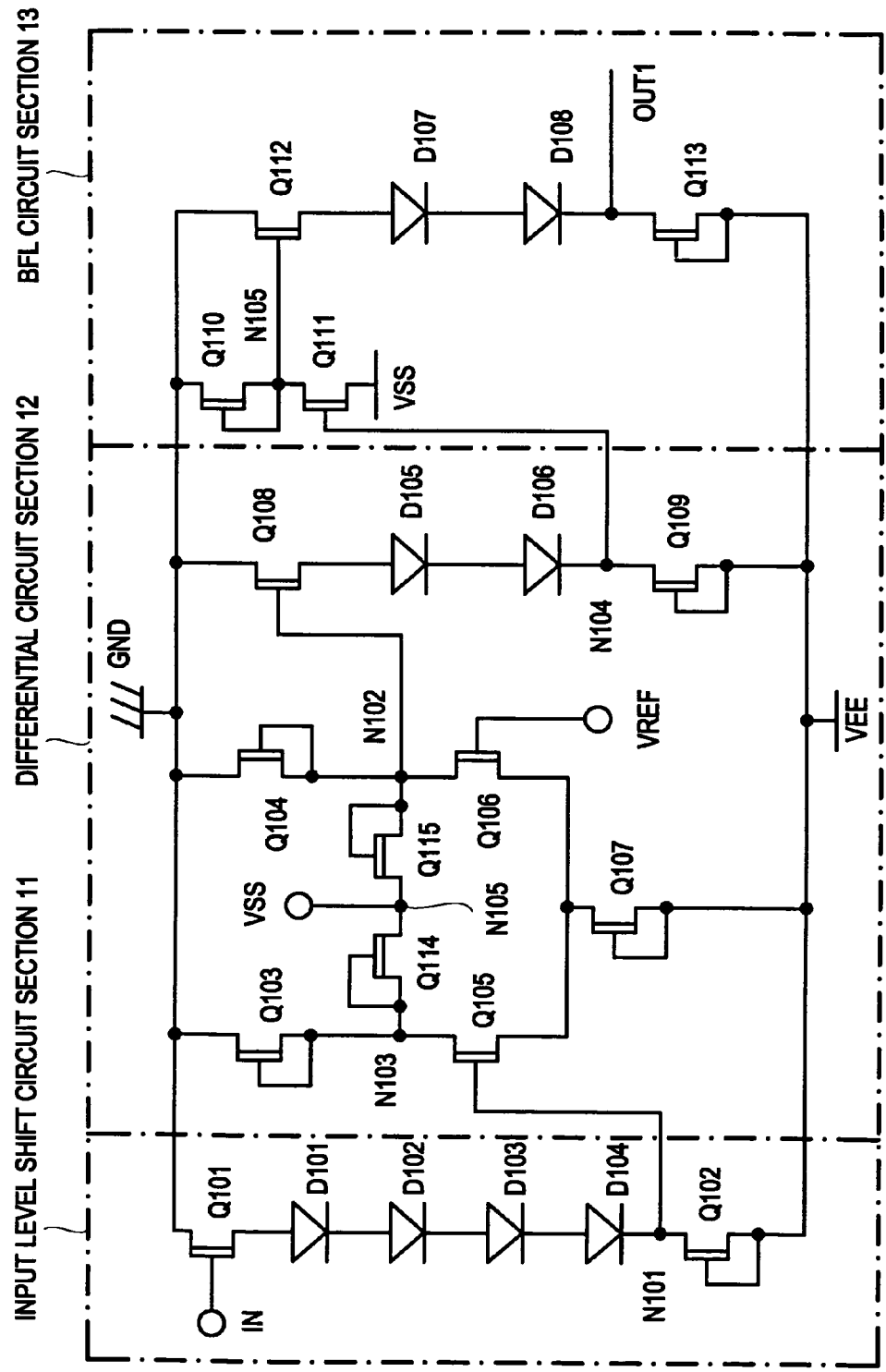
FIG. 2 is a diagram showing a configuration of a level shift circuit of Patent Document 1.
Figure 3:
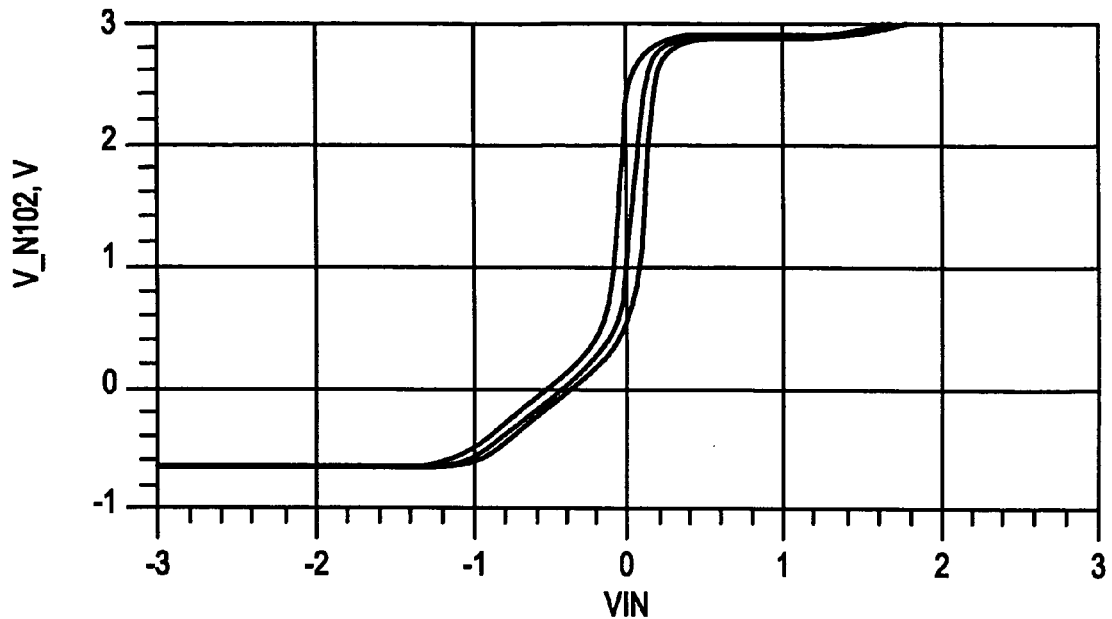
FIG. 3 is a graph showing an input-output characteristic of the level shift circuit of FIG. 2.
Figure 4:
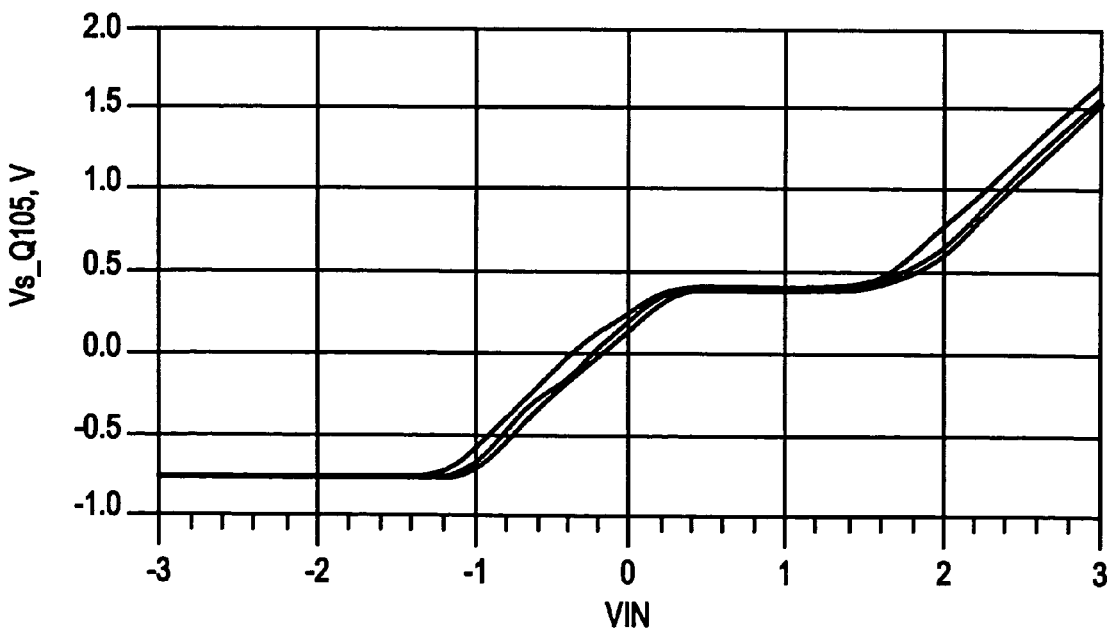
FIG. 4 is a graph showing an input-output characteristic of the level shift circuit of FIG. 2.

Exemplary embodiments of the present invention will be described. In a first exemplary embodiment of the present invention, as shown in FIG. 1, there are provided: a first resistor (R21) having one end connected to GND (ground), a first transistor (E21) having a drain and a gate connected to the other end of the first resistor (R21), and a source connected to a first power supply (CPOUT), a second transistor (E22) having a source connected to the first power supply (CPOUT), and a gate connected to the drain and the gate of the first transistor (E21), a second resistor (R22) having one end connected to a drain of the second transistor (E22), a third transistor (E23) having a source connected to the other end of the second resistor (R22), and a gate connected to an input terminal (Vin), a first constant current source (A) connected between a second power supply (VDD) and a drain of the third transistor (E23), and an output stage circuit including a fourth transistor (E24) having a gate connected to the drain of the second transistor (E22) and being connected between an output terminal (Vout) and the first power supply (CPOUT).

In the present invention, a first constant current source (A) includes a fifth transistor (D20) having a drain connected to the second power supply (VDD), and a third resistor (R20) connected between a source and a gate of the fifth transistor (D20), wherein a connection node of the gate of the fifth transistor (D20) and the third resistor (R20) is connected to the drain of the third transistor (E23).

In the present invention, the output stage circuit includes a transistor (D21) connected between the second power supply (VDD) and the output terminal (Vout).

Figure 16:
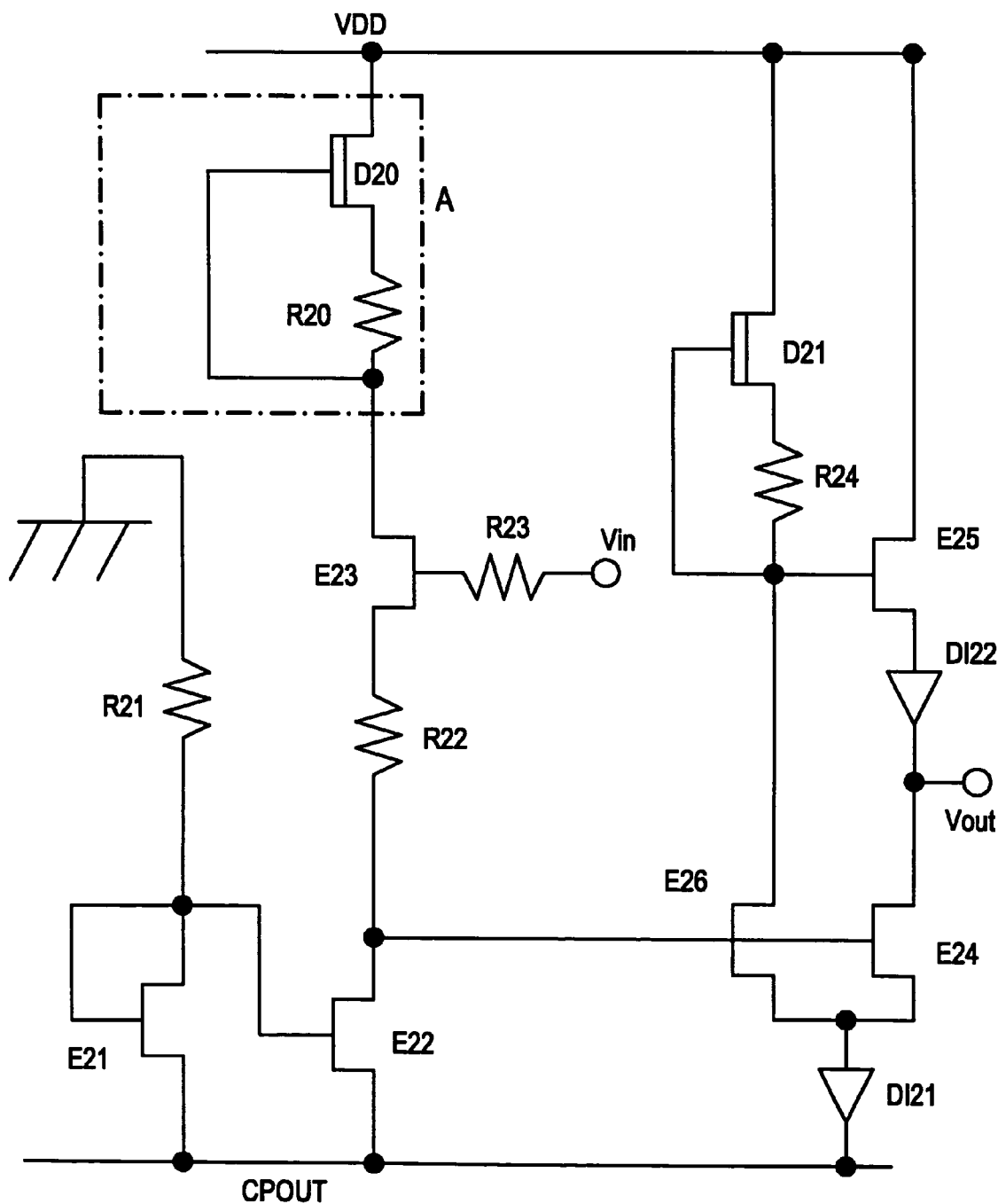
FIG. 16 is a diagram showing a configuration of a second exemplary embodiment of the present invention by an equivalent circuit.

In the present invention, referring to FIG. 16, the output stage circuit may be provided with a sixth transistor (E26) having a drain connected to the second current source (D21, R24), a gate connected to the drain of the second transistor (E22), and a source connected to a source of the fourth transistor (E24), a first diode (D121) connected between the coupled sources of the fourth and the sixth transistors (E24 and E26) and the first power supply (CPOUT), a seventh transistor (E25) having a drain connected to the second power supply (VDD), and a gate connected to a connection node of the second current source and the sixth transistor (E26), and a second diode (D122) connected between a source of the seventh transistor (E25) and the output terminal (Vout). The second current source includes an eighth transistor (D21) having a drain connected to the second power supply (VDD), and a fourth resistor (R24) connected between a source and a gate of the eighth transistor (D21), wherein a connection node of the gate of the eighth transistor (D21) and the fourth resistor (R24) is connected to the drain of the sixth transistor (E26).

Figure 17:
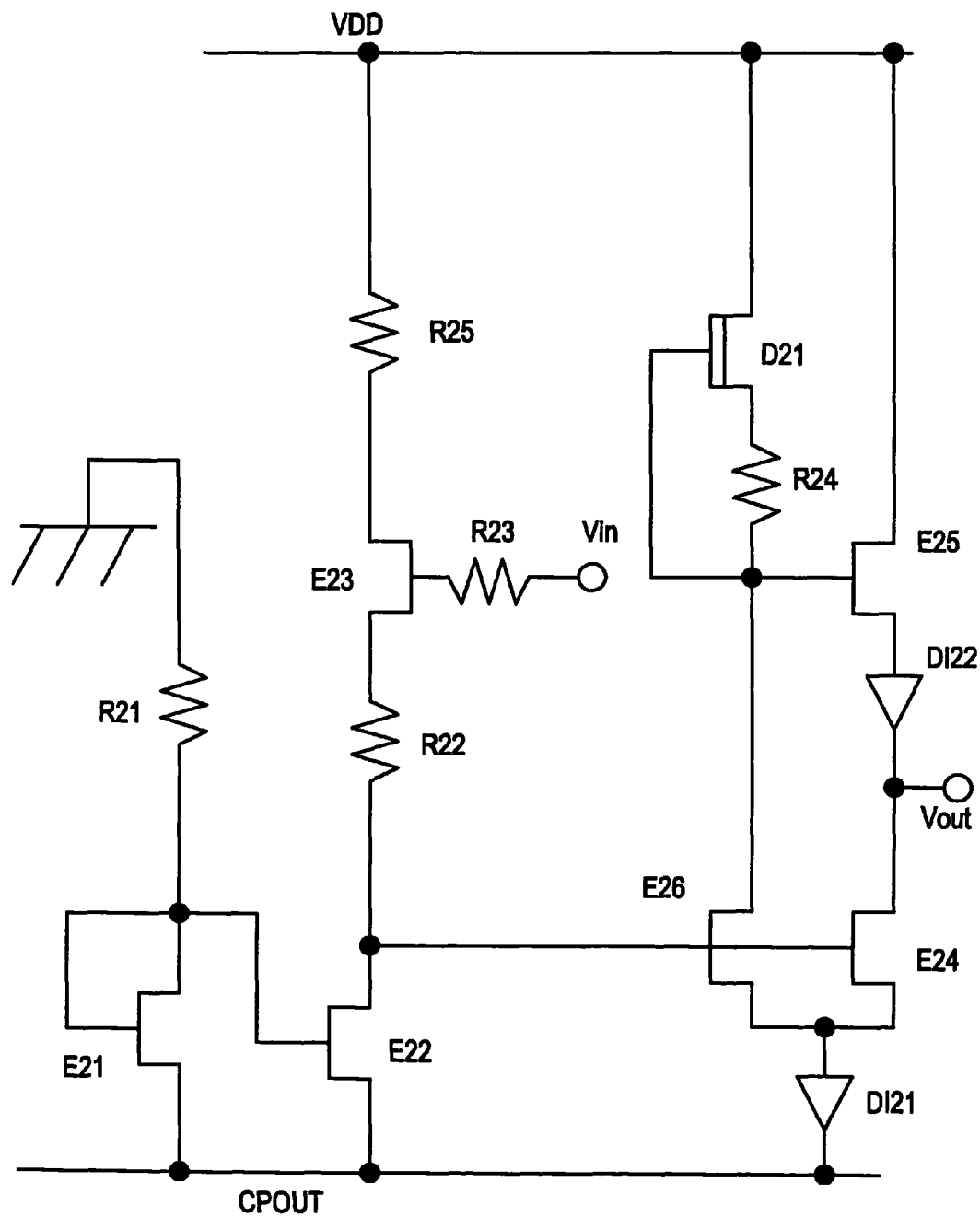
FIG. 17 is a diagram showing a configuration of a third exemplary embodiment of the present invention by an equivalent circuit.

In the present invention, referring to FIG. 17, the first constant current source (A) may be configured by a fifth resistor (R25) connected between the second power supply (VDD) and the drain of the third transistor (E23).

Figure 18:
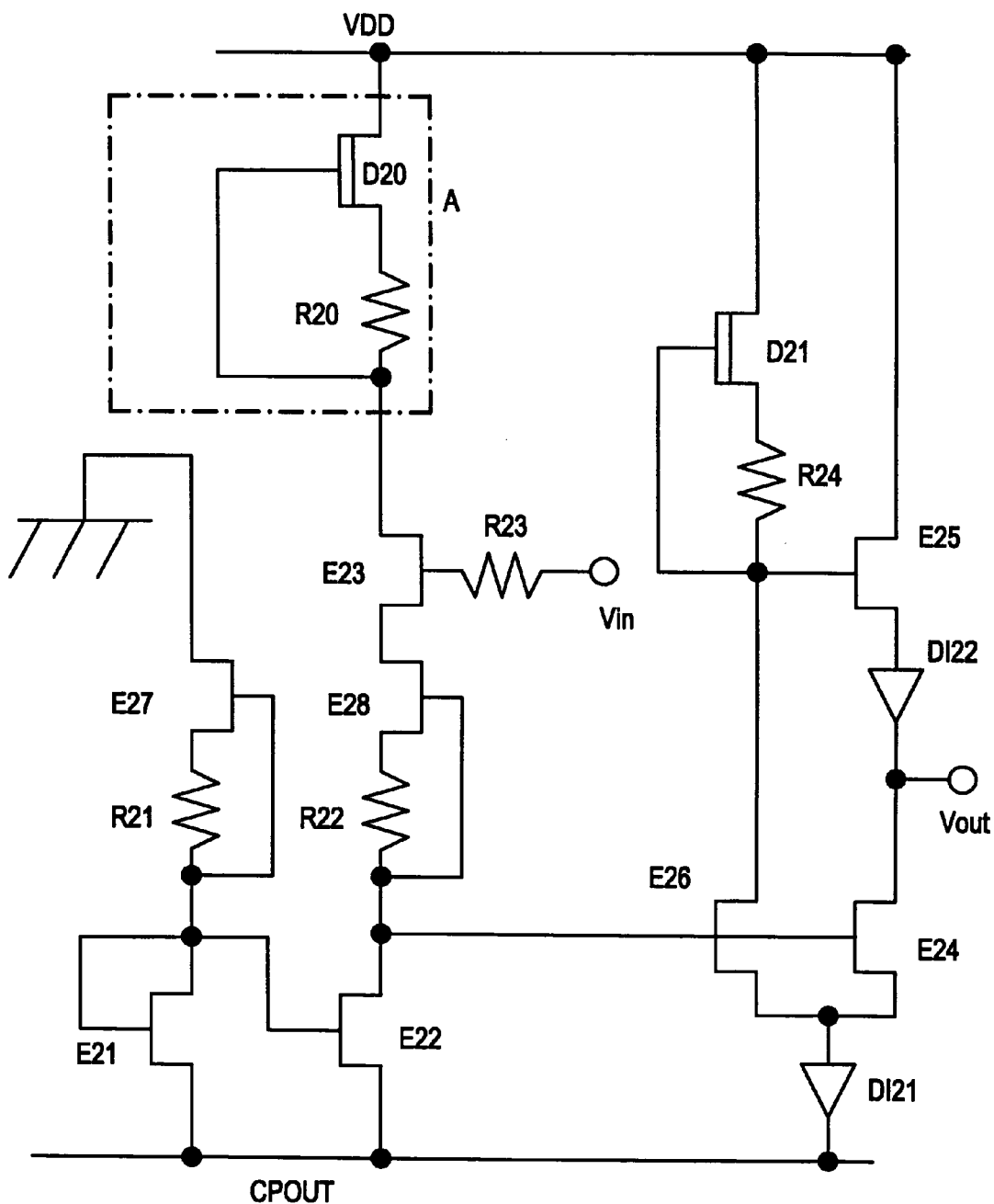
FIG. 18 is a diagram showing a configuration of a fourth exemplary embodiment of the present invention by an equivalent circuit.

In the present invention, referring to FIG. 18, a ninth transistor (E27) is provided between one end of the first resistor (R21) and GND (ground). A drain of the ninth transistor (E27) is connected to the ground, a source of the ninth transistor (E27) is connected to one end of the first resistor (R21), and a gate of the ninth transistor (E27) is connected to the other end of the first resistor (R21). A tenth transistor (E28) is provided between the source of the third transistor (E23) and the second resistor (R22). A drain of the tenth transistor (E28) is connected to the source of the third transistor (E23), a source of the tenth transistor (E28) is connected to one end of the second resistor (R22), and a gate of the tenth transistor (E28) is connected to the other end of the second resistor (R22).

Figure 19:
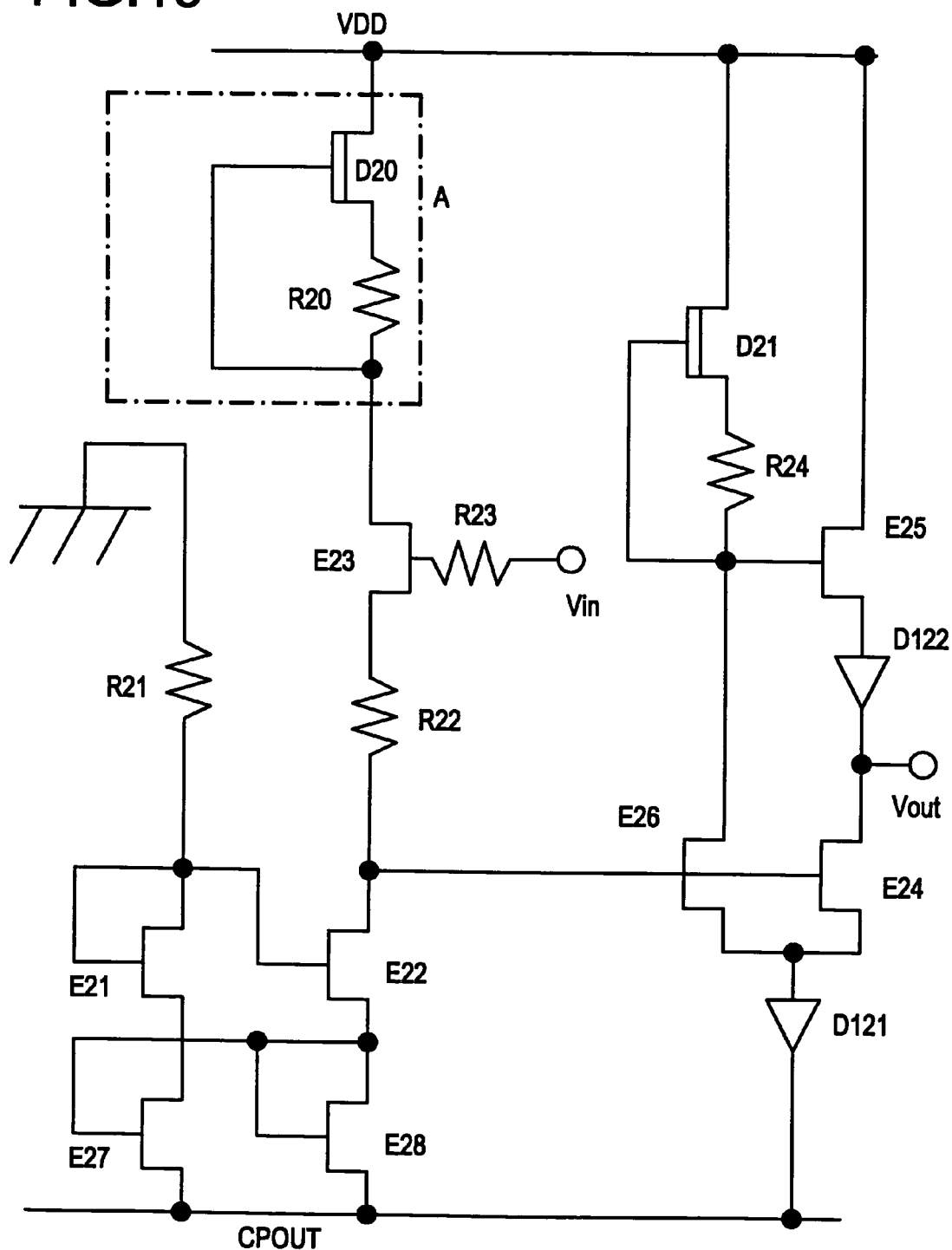
FIG. 19 is a diagram showing a configuration of a fifth exemplary embodiment of the present invention by an equivalent circuit.

In the present invention, referring to FIG. 19, there may be provided an eleventh transistor (E27) having a drain connected to the source of the first transistor (E21), and a source connected to the first power supply (CPOUT), and a twelfth transistor (E28) having a drain connected to the source of the second transistor (E22), a source connected to the first power supply, and a connection node of a gate and the drain connected to the gate of the eleventh transistor (E27).

Figure 20:
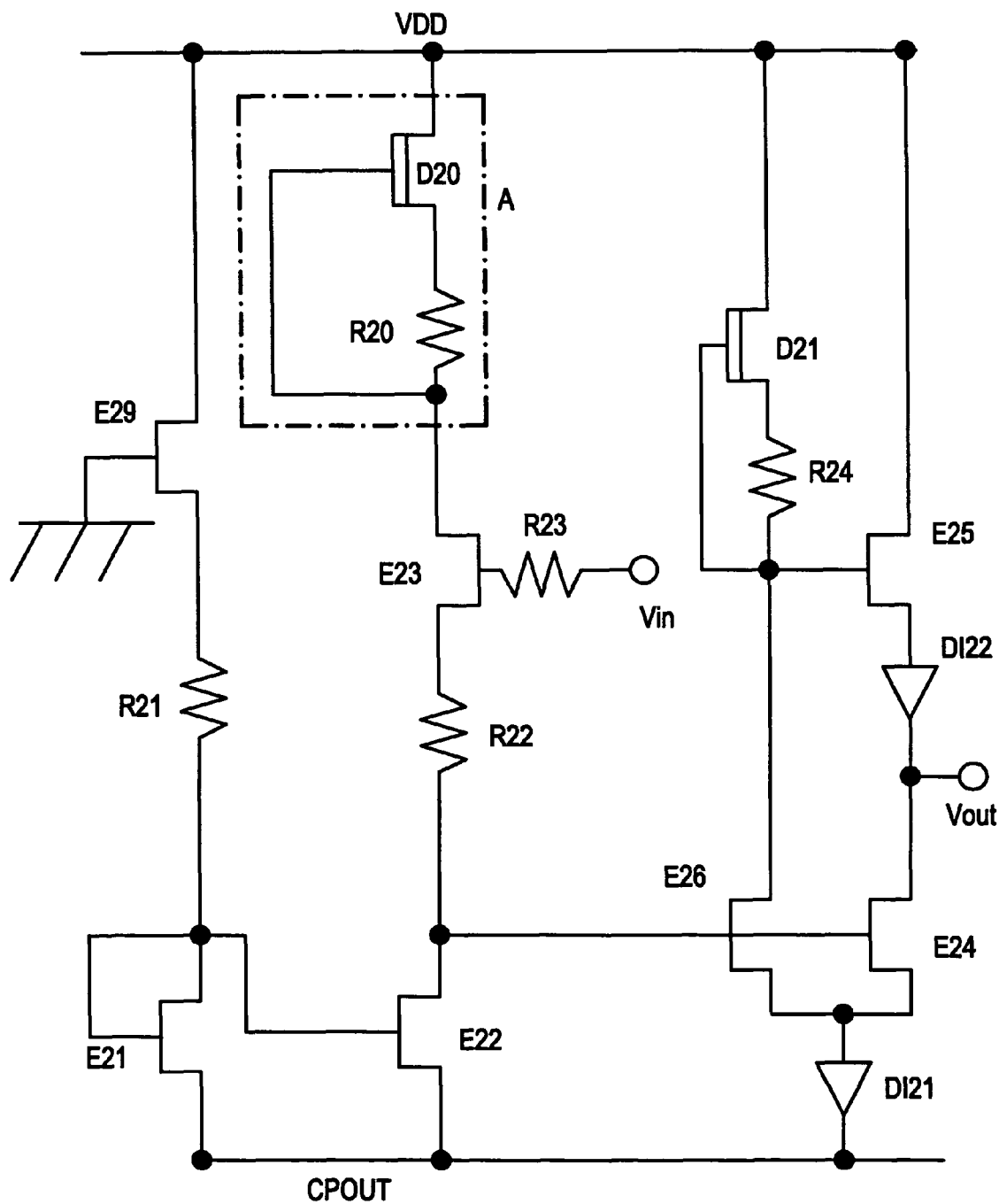
FIG. 20 is a diagram showing a configuration of a sixth exemplary embodiment of the present invention by an equivalent circuit.

In the present invention, referring to FIG. 20, there may be provided a thirteenth transistor (E29) having a drain connected to the second power supply (VDD), a gate connected to a ground terminal, and a source connected to one end of the first resistor.

Figure 21:
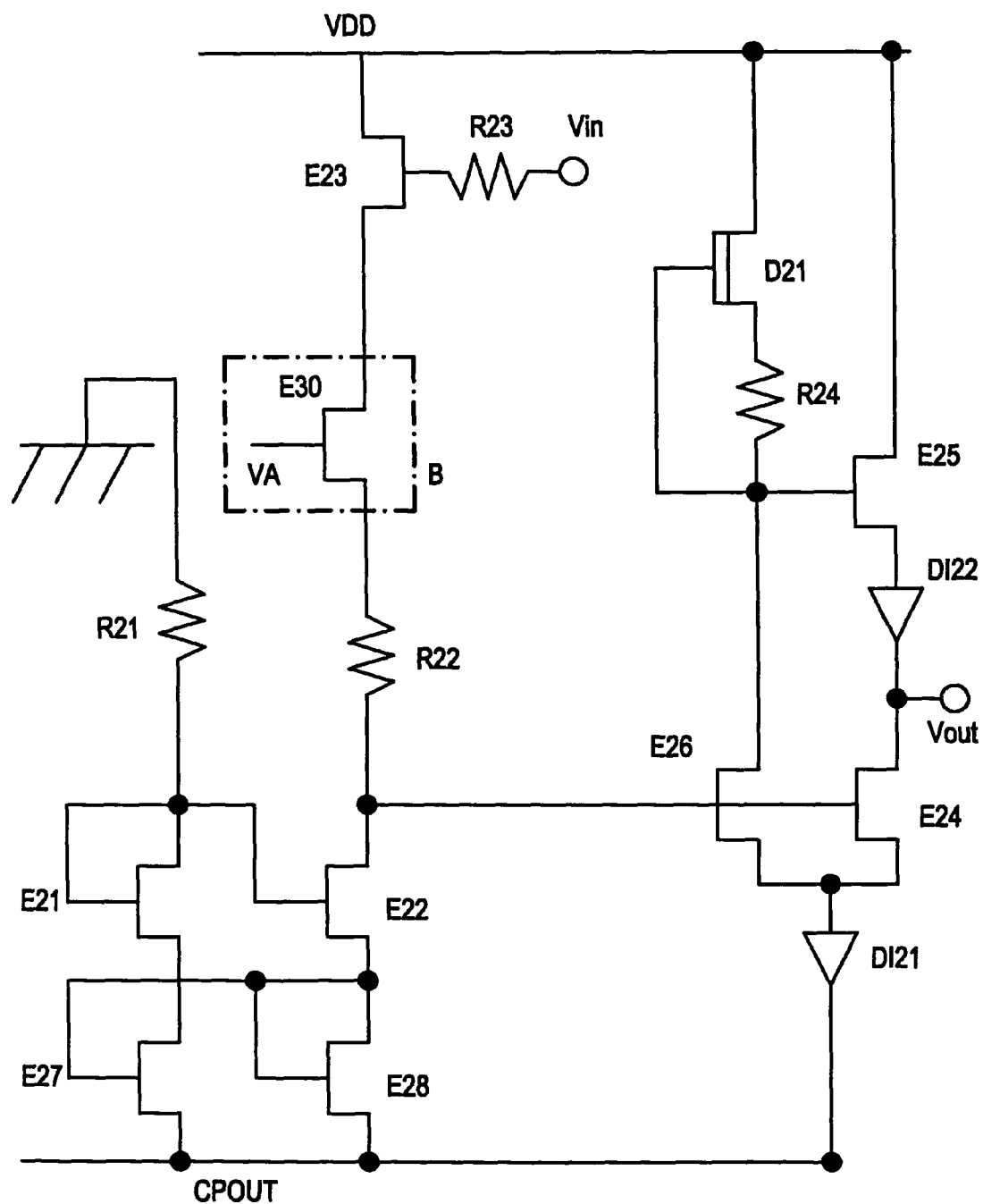
FIG. 21 is a diagram showing a configuration of a seventh exemplary embodiment of the present invention by an equivalent circuit.

Alternatively, referring to FIG. 21, in the present invention, there may be provided a transistor (E30) having a gate grounded. The transistor (E30) is inserted between the third transistor (E23) and the second resistor (R22) for voltage compensation between drain and source of the transistors (E22, E28) that are cascode-connected. In this case, the third transistor (E23) is directly connected to the second power supply (VDD). A more detailed description is given below according to an exemplary embodiment.

FIG. 1 is a diagram showing a configuration of one exemplary embodiment of the present invention by an equivalent circuit. Referring to FIG. 1, there are provided a constant current source A connected to a power supply VDD, an NFET E23 having a drain connected to an output of the constant current source A, and a gate connected via a resistor R23 to an input terminal Vin, an NFET E22 having a source connected to CPOUT, and a drain connected via a resistor R22 to a source of the NFET E23, and an NFET E21 having a source connected to CPOUT, a gate and a drain commonly connected to a gate of the NFET E22. A common connection node of the gate and drain of NFET E21 is connected via a resistor R21 to GND (ground). There are also provided an NFET E24 having a source connected to CPOUT, a gate connected to the drain of the NFET E22, and a drain connected to an output terminal Vout, and a depletion NFET D21 having a drain connected to VDD and a gate and a source coupled together. The NFETs E21 and E22 of FIG. 1 correspond to NFETs 4 and 7 of FIG. 5 and compose a current mirror. The NFET E23 of FIG. 1 corresponds to NFET 5 of FIG. 5. The NFETs D21 and E24 of FIG. 1 correspond to NFETs 8 and 9 of FIG. 5 and compose an output circuit. The constant current source A includes a depletion NFET D20 having a drain connected to VDD, and a resistor R20 having one end connected to a source of the NFET D20 and the other end connected to a gate of the NFET D20. In FIG. 1, E21, E22, E23, and E24 are each an enhancement mode NFET (GaAs FET), while D20 and D21 are each a depletion mode NFET (GaAs FETs).

Figure 8:
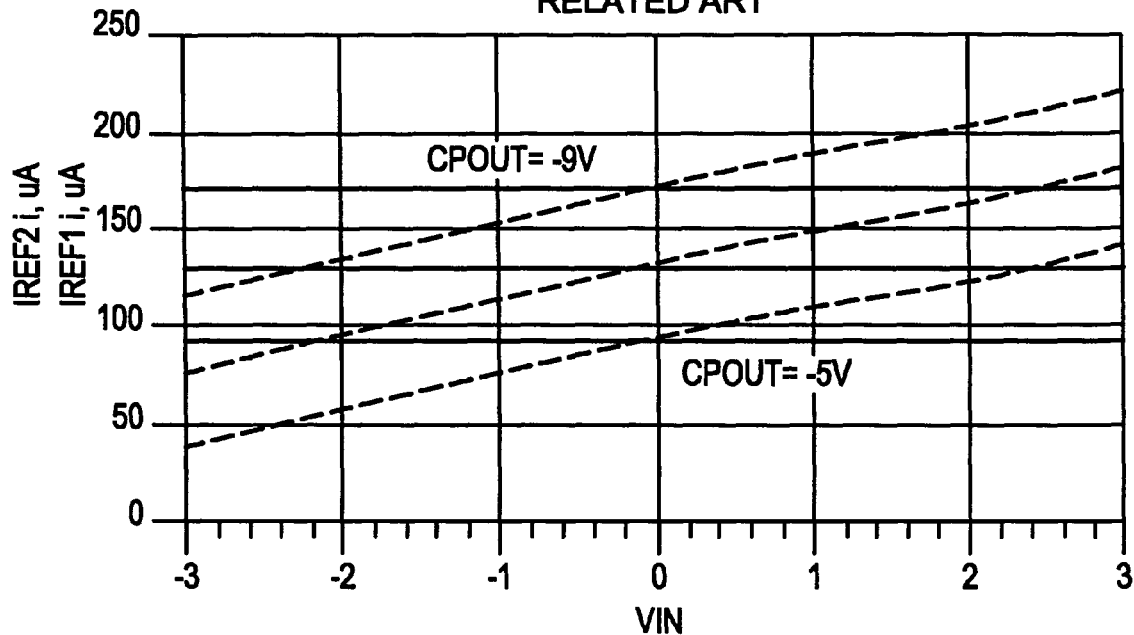
FIG. 8 is a diagram showing a current characteristic for an input voltage of the level shift circuit of FIG. 5.
Figure 9:
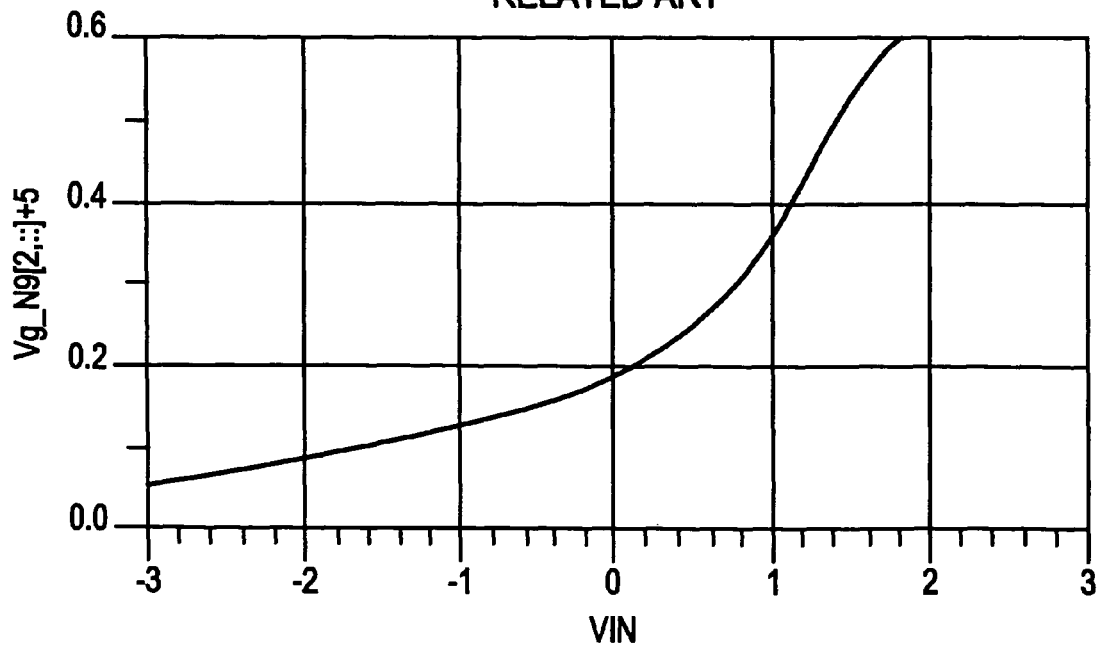
FIG. 9 is a diagram showing a gate potential characteristic (CPOUT=−5V) of the FET N9 for an input voltage of the level shift circuit of FIG. 5.
Figure 10:
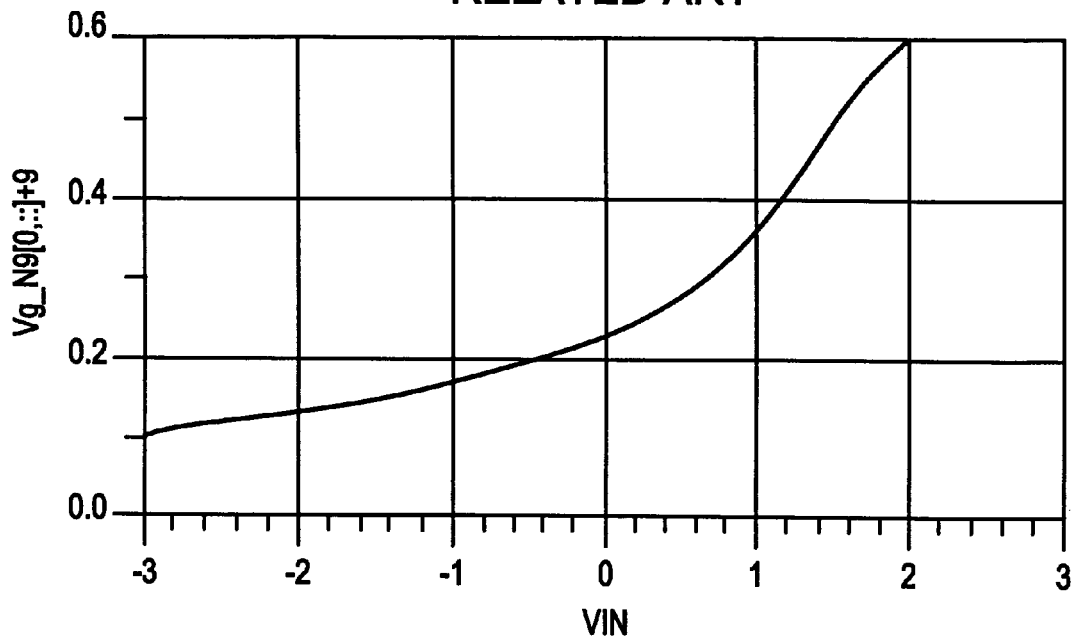
FIG. 10 is a diagram showing a gate potential characteristic (CPOUT=−9V) of the FET N9 for an input voltage of the level shift circuit of FIG. 5.

CPOUT is assumed to be from −5V to −9V. A current value of the constant current source A, for CPOUT=−5V, is set to be larger than a value of a current IREF1 flowing in a first current path formed of the resistor R21 and the enhancement mode NFET E21, and for CPOUT=−9V, is set to be smaller than the value of IREF1. In this way, with CPOUT=−5V, for example, a result similar to the simulated result of FIG. 8 described above is obtained.

With CPOUT=−9V, a source potential Vs (E23) of the NFET E23 becomes lower than VIN, by the constant current source A, and a current value of a second current path IREF2 composed by the constant current source A, the NFET E23, the resistor R22, and the NFET E22 becomes small. As a result, a potential Vgs_E24 between gate and source of the enhancement NFET E24 is approximately the same as when CPOUT=−5V. Results of simulation thereof are shown in FIG. 11 to FIG. 15.

Figure 11:
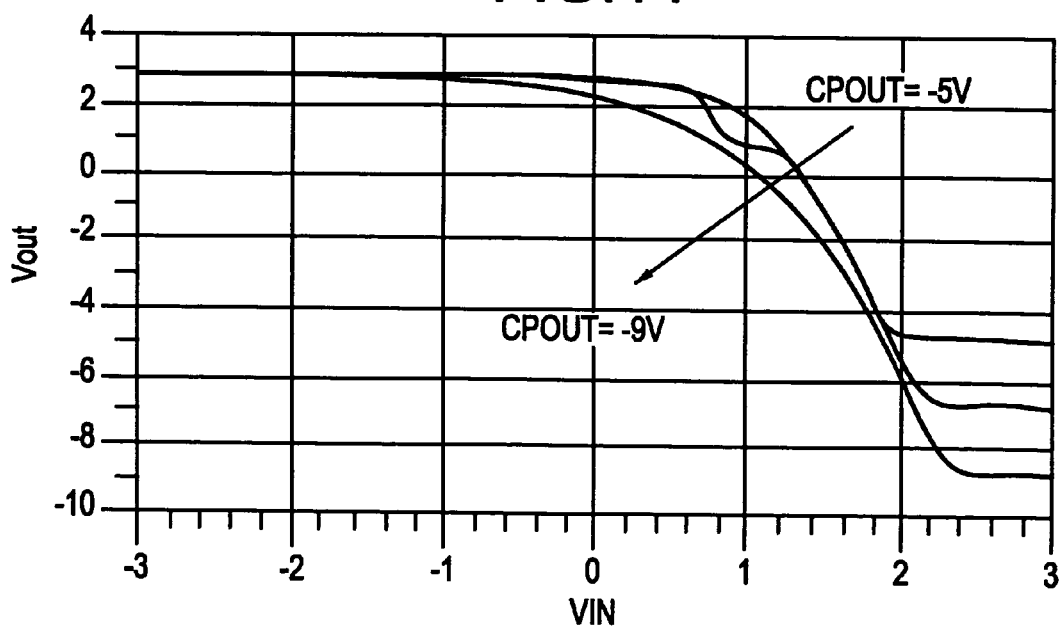
FIG. 11 is a graph showing an input-output characteristic (input voltage VIN and output voltage Vout) in the first exemplary embodiment of the present invention.
Figure 12:
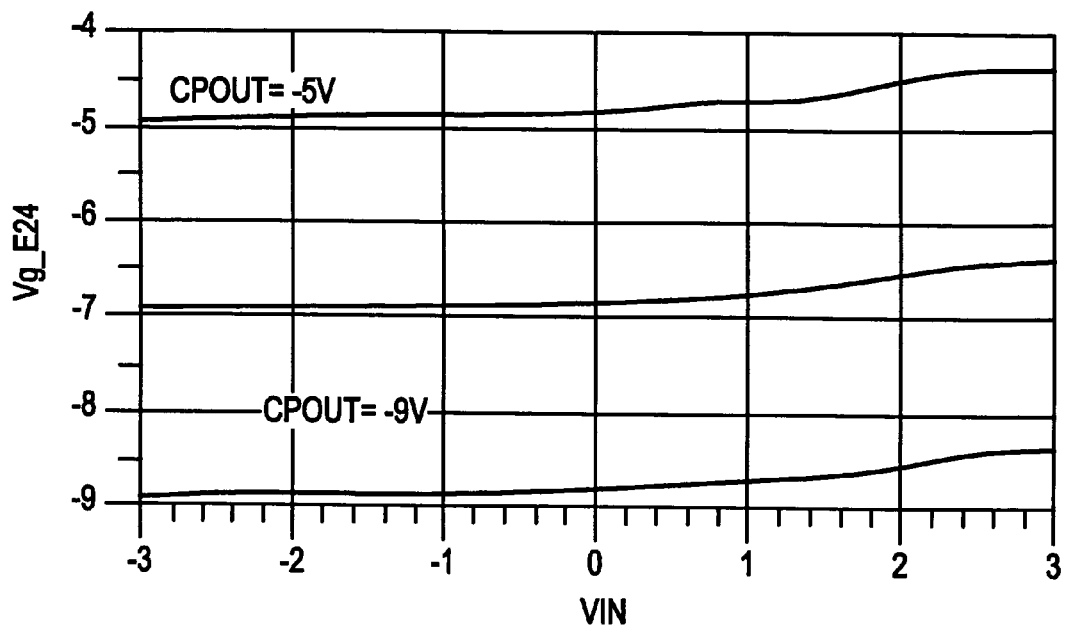
FIG. 12 is a graph showing an input-output characteristic (input voltage VIN and Vg_E24) in the first exemplary embodiment of the present invention.
Figure 13:
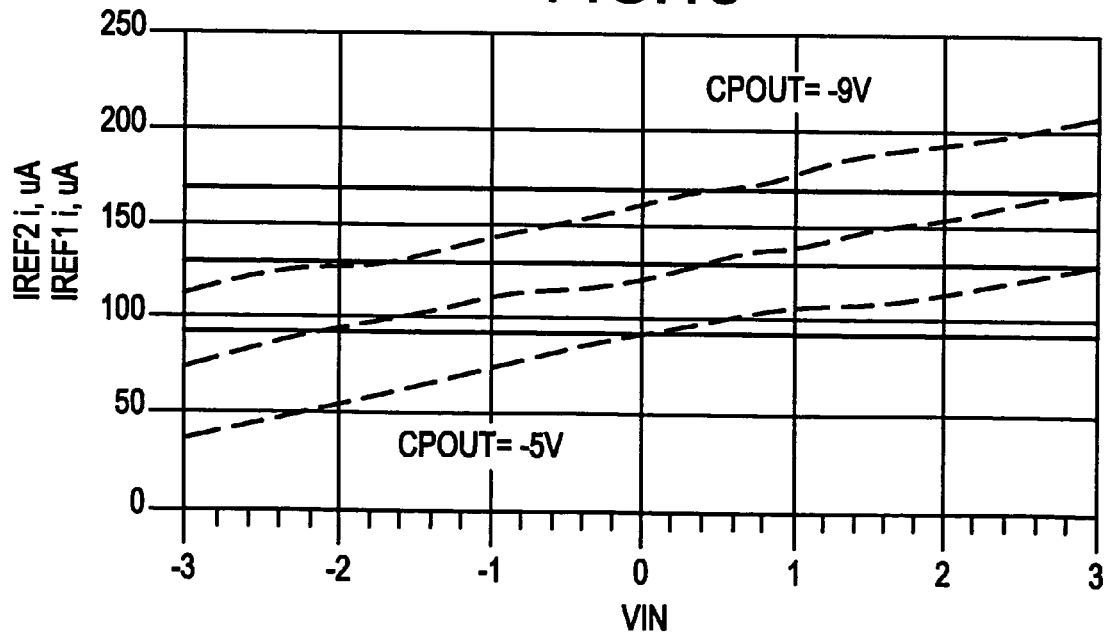
FIG. 13 is a diagram showing characteristics of the input voltage VIN and currents IREF1 and IREF2 in the first exemplary embodiment of the present invention.
Figure 14:
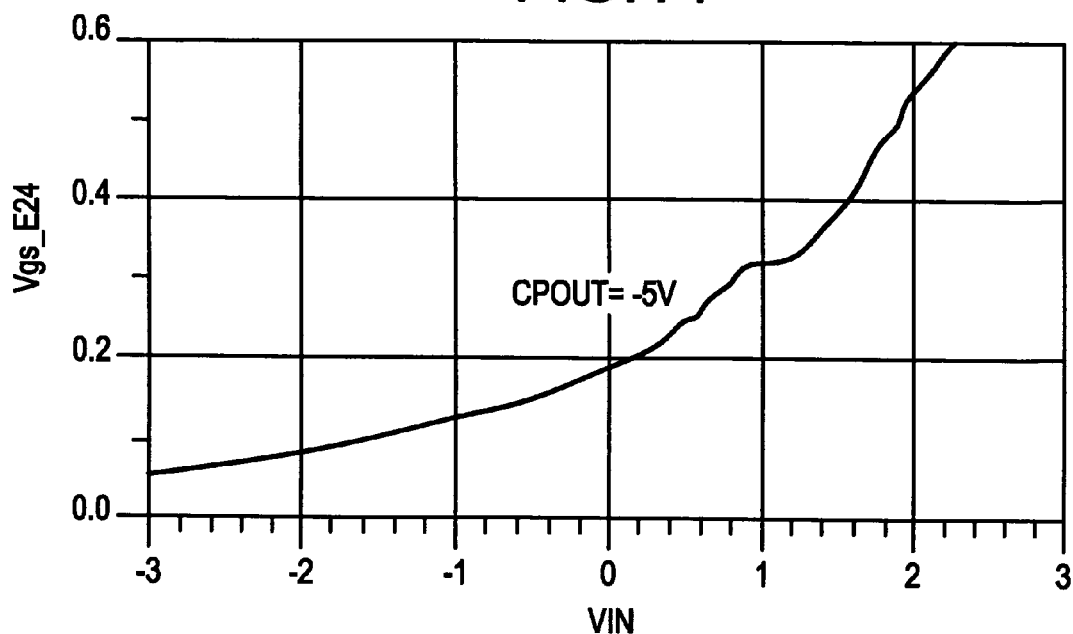
FIG. 14 is a diagram showing a characteristic of the input voltage VIN and a gate-to-source voltage Vg_E24 of a transistor E24 in the first exemplary embodiment of the present invention.
Figure 15:
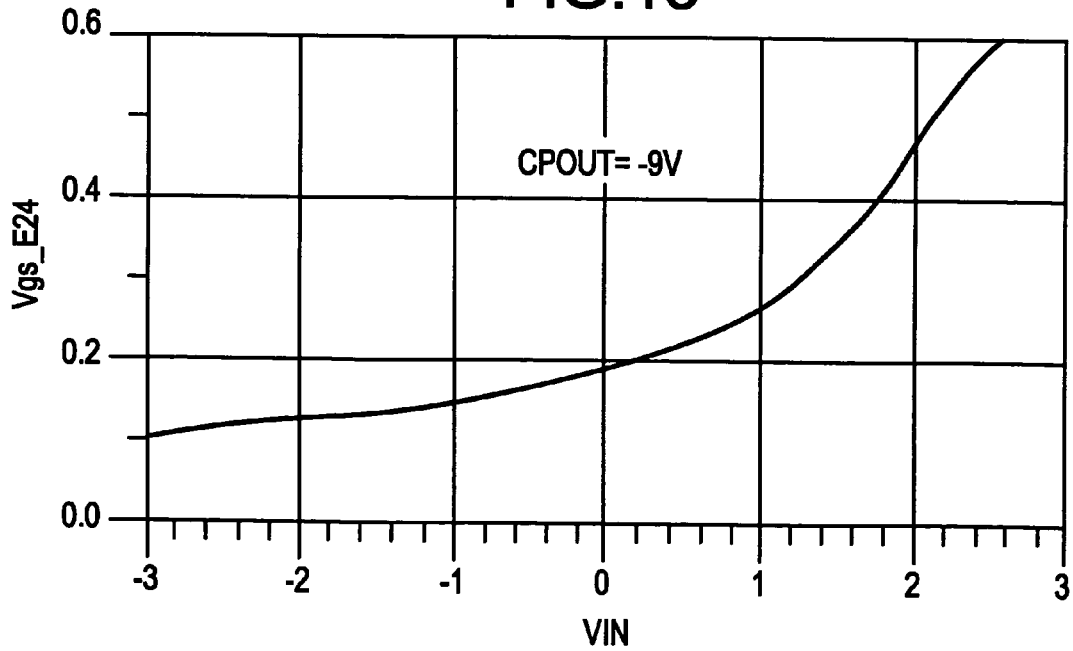
FIG. 15 is a diagram showing a characteristic of the input voltage VIN and the gate-to-source voltage Vg_E24 of the transistor E24 in the first exemplary embodiment of the present invention.

FIG. 11 is a simulation result of an input-output characteristic of the input voltage VIN and the output voltage Vout for CPOUT=−5V, −7V, and −9V. FIG. 12 is a simulation result of a characteristic of the input voltage VIN and Vg_E24 (gate voltage of NFET E24) for CPOUT=−5V, −7V, and −9V. FIG. 13 is a graph showing a characteristic of the input voltage VIN, the current value IREF1 (drain current of the NFET E21) flowing in the first current path, and the current value IREF2 (drain current of the NFET E22) flowing in the second current path, for CPOUT=−5V, −7V, and −9V. FIG. 14 is a simulation result of a characteristic of the input voltage VIN and Vgs_E24 (gate-to-source potential of the NFET E24) when CPOUT=−5V, and FIG. 15 is a simulation result of a characteristic of the input voltage VIN and Vgs_E24 (gate-to-source potential of the NFET E24) when CPOUT=−9V. Below, input voltage of the input terminal VIN and output voltage of the output terminal Vout are expressed as VIN and Vout.

In the present exemplary embodiment, as shown in FIG. 14 and FIG. 15, looking at the value of the gate-to-source voltage Vgs_E24 of the NFET E24 with VIN=0V, it is understood that there is almost no change in the value between a case where CPOUT=−5V and a case where CPOUT=−9V.

As a result, according to the present exemplary embodiment, as shown in FIG. 11, a threshold of the output voltage with regard to the input voltage VIN is almost independent of the value of CPOUT and can have an approximately predetermined value.

A threshold of the output voltage Vout with regard to the input voltage VIN is GND, which is the power supply of the first current path, but in changing this threshold without using a reference power supply, it is necessary to change the ratio of the resistor R21 to the resistor R22.

Figure 5:
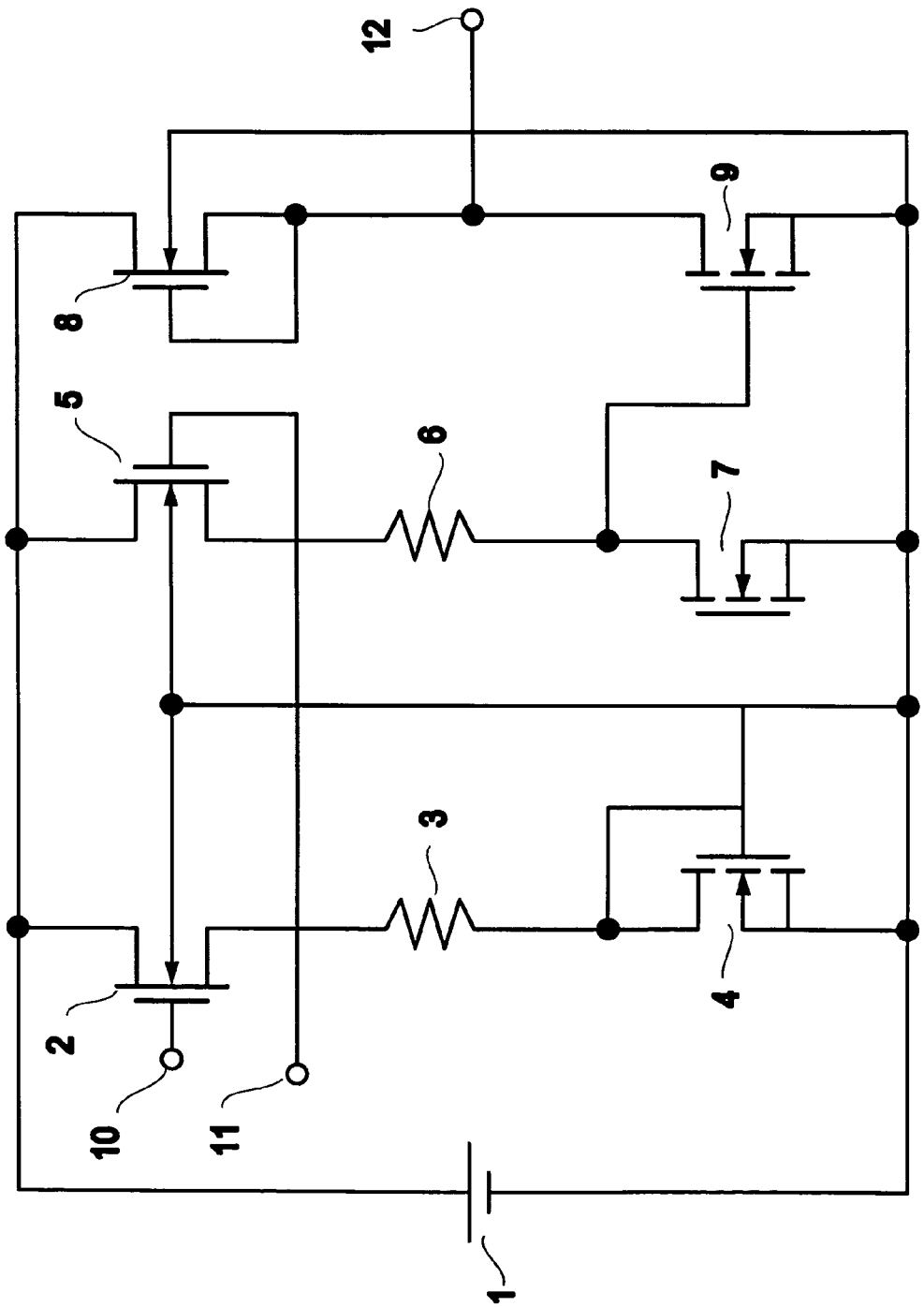
FIG. 5 is a diagram showing a configuration of a level shift circuit of Patent Document 2.
Figure 6:
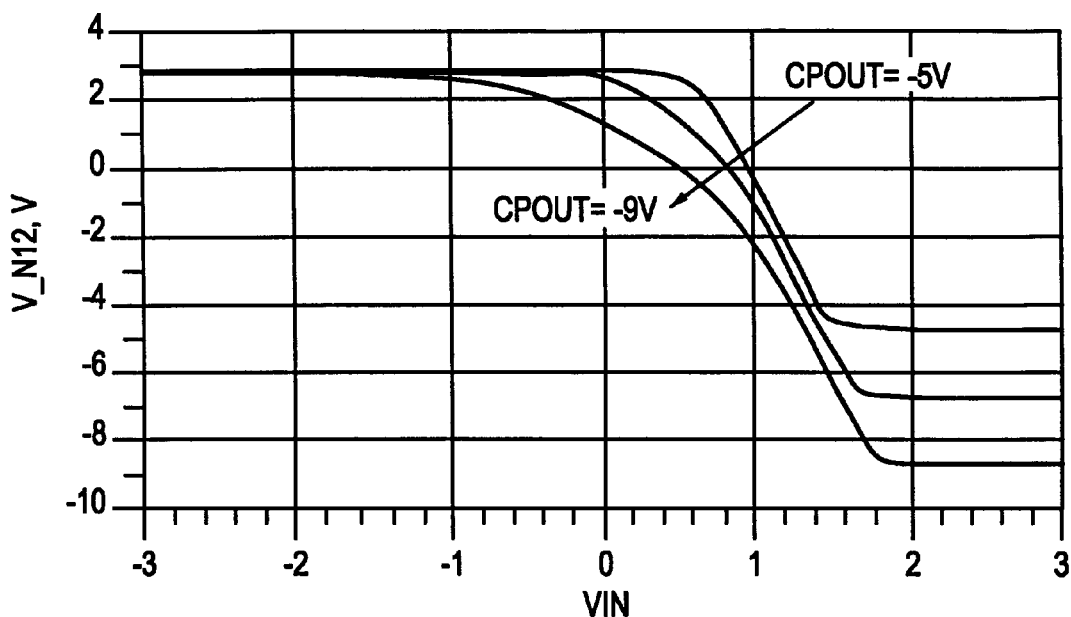
FIG. 6 is a graph showing an input-output characteristic of the level shift circuit of FIG. 5.
Figure 7:
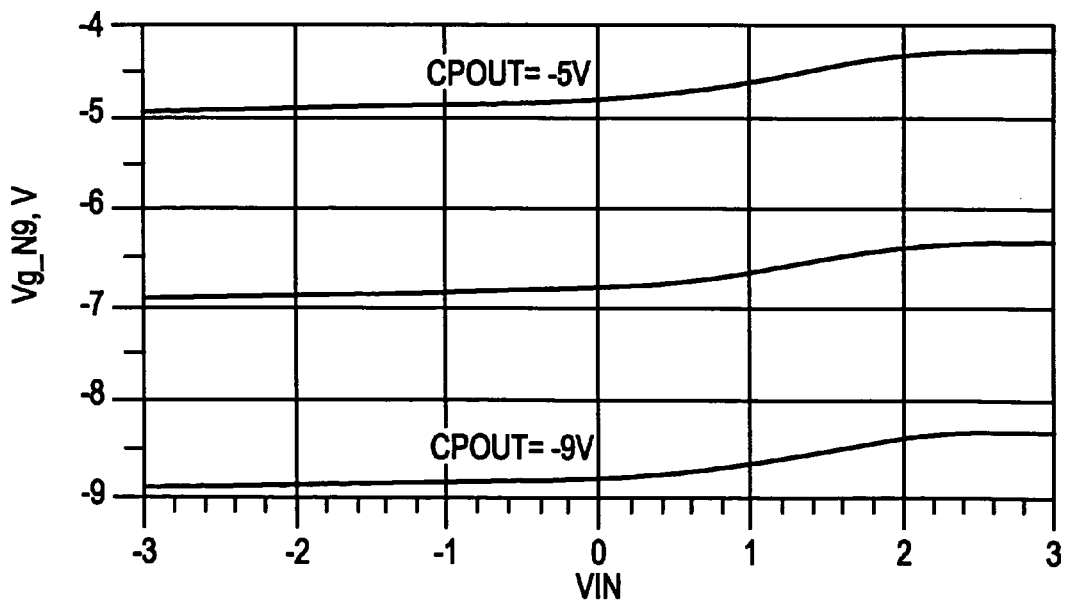
FIG. 7 is a diagram showing a gate voltage characteristic of an FET N9 for an input voltage of the level shift circuit of FIG. 5.

As a comparative example, consideration is given to a case of a configuration (FIG. 1 in Patent Document 2) described referring to FIG. 5. Theoretically, the abovementioned expression (6), as described above, holds:

$$Vg(NFET9) = VIN - \frac{R6}{R3}(-VT - CPOUT) \qquad (6)$$

In expression (6), if R6/R3=0.8 is selected, for example, the threshold of the output voltage V_N12 with regard to the input voltage VIN is $$Vg(NFET9) - CPOUT = \qquad (7)$$
$$VIN - \frac{R6}{R3}(-VT - CPOUT) - CPOUT = VT$$
$$VIN - 0.8(-VT - CPOUT) - CPOUT = VT$$
$$VIN - 0.2CPOUT = 0.2VT$$
$$VIN = 0.2VT + 0.2CPOUT$$

Thus, if CPOUT is approximately −5V to −9V, the input voltage VIN is negative, and it is possible to change the threshold.

However, since a term of an input voltage CPOUT is included in Equation (7), the threshold of the input voltage VIN for the output voltage V_N12 becomes small, similar to the negative power supply voltage CPOUT becoming small. That is, the threshold of the output voltage V_N12 with regard to the input voltage VIN follows the power supply voltage CPOUT which varies.

On the contrary, in the present exemplary embodiment, the gate potential Vg_E24 of the NFET E24 becomes small as CPOUT becomes small, so that it is possible to inhibit variation of the threshold of the output voltage Vout with regard to the input voltage VIN, due to the variation of the CPOUT. As a result, the threshold of the output voltage Vout with regard to the input voltage VIN is almost independent of the value of the CPOUT, and can have an almost predetermined value.

In turning on and off a switch using an FET on a GaAs-substrate, since, in general, a potential differences above predetermined values should not be applied to a FET gate-to-source voltage and to a gate-to-drain voltage, respectively, when the value of the negative power supply voltage CPOUT becomes equal to or lower than a predetermined value, there may be a case where it is necessary to have a function for changing the output potential Vout, not to a negative power supply voltage, but to a positive power supply voltage or GND. In a circuit shown in FIG. 1, a maximum current of the second current path IREF2 is a constant current source A. Therefore, in a case where a negative power supply voltage CPOUT drops, and the current value of the first current path IREF1 becomes larger than the current value of the constant current source A, the FETs E21 and E22 that form a current mirror do not function as a current mirror any more.

Since the depletion NFET D20 that constitutes the constant current source A increases the drain-to-source voltage, a potential of a connection node of the constant current source A and the drain of the enhancement NFET E23 drops more than the input voltage VIN. The potential of the connection node of the constant current source A and the drain of the enhancement NFET E23 appears at the source of the enhancement NFET E23. In this state, even if the input voltage Vin changes from GND to a positive power supply voltage VDD, the gate-to-source potential difference of the enhancement NFET E24 is always less than or equal to a threshold VT. As a result, the power supply voltage. VDD appears at the output terminal Vout.

FIG. 16 is a diagram showing a configuration of a second exemplary embodiment of the present invention by an equivalent circuit. In the present exemplary embodiment, there are provided, as an output stage circuit, a depletion mode NFET D21 having a drain connected to a power supply VDD, a resistor R24 connected between a source and a gate of the NFET D21, an NFET E26 having a drain connected to a connection node of the gate of the NFET D21 and the resistor R24, and a gate connected to a drain of an NFET E22, an NFET E25 having a drain connected to a power supply VDD, and a gate connected to the gate of the NFET D21, a diode D122 connected between a source of the NFET E25 and an output terminal Vout, and an NFET E24 having a drain connected to the output terminal Vout, and a gate connected to a drain of the NFET E22, wherein the sources of the NFETs E24 and E26 are commonly connected and are connected via a diode D121 to a negative power supply voltage CPOUT. In FIG. 16, a configuration other than the output stage circuit has the same configuration as FIG. 1. In the present exemplary embodiment, an upper limit and a lower limit of a voltage range of the output voltage Vout are each narrowed by a forward direction voltage VF of the diodes D121 and D122, but a threshold of the output voltage Vout with regard to an input voltage VIN is almost independent of a value of the CPOUT, and can have an almost predetermined value.

FIG. 17 is a diagram showing a configuration of a third exemplary embodiment of the present invention by an equivalent circuit. As shown in FIG. 17, in the present exemplary embodiment, the constant current source A of FIG. 1 is replaced by a resistor R25. An output stage circuit has an identical configuration to FIG. 16.

FIG. 18 is a diagram showing a configuration of a fourth exemplary embodiment of the present invention by an equivalent circuit. The configuration of FIG. 18 is further provided enhancement mode NFETs E27 and E28 with regards to the configuration of FIG. 16. More specifically, the enhancement mode NFETs E27 is provided between GND and a resistor R21, wherein a drain of the NFET E27 is connected to GND, a source is connected to one end of the resistor R21, and a gate is connected to the other end of the resistor R21, that is, to a gate and drain of a NFET E21 and the enhancement mode NFET E28 between a source of the NFET E23 and a resistor R22. A drain of the NFET E28 is connected to the source of the NFET E23, a source is connected to one end of the resistor R22, and a gate is connected to the other end of the resistor R22, that is, to a drain of a NFET E22. An output stage circuit has an identical configuration to FIG. 16. In the present exemplary embodiment, an operational effect is realized that is the same as the exemplary embodiment of FIG. 1, with regard to the variation of CPOUT.

FIG. 19 is a diagram showing a configuration of a fifth exemplary embodiment of the present invention by an equivalent circuit. In the configuration of FIG. 19, a second current mirror (enhancement mode NFETs E27 and E28) is cascode-connected between a first current mirror (enhancement mode NFETs E21 and E22) and a negative power supply voltage CPOUT, with input and output interchanged with regard to the configuration of FIG. 16. A drain of the NFET E27 forming output of the second current mirror is connected to a source of the NFET E21 constituting an input side of the first current mirror, a drain of the NFET E28 (a connection node of a drain and a gate is connected to a gate of the NFET E27) forming input of the second current mirror is connected to a source of the NFET E22 constituting an input side of the first current mirror, and sources of the NFETs E27 and E28 are commonly connected to CPOUT. An output stage circuit has an identical configuration to FIG. 16. In the present exemplary embodiment, an operational effect is realized that is the same as the exemplary embodiment of FIG. 1, with regard to variation of CPOUT.

FIG. 20 is a diagram showing a configuration of a sixth exemplary embodiment of the present invention by an equivalent circuit. In the configuration of FIG. 20, there is further provided an enhancement mode NFET E29 having a drain connected to a power supply VDD, and a gate connected to GND, wherein a source of the NFET E29 is connected to a resistor R21 with regard to the configuration of FIG. 16. In the present exemplary embodiment, an operational effect is realized that is the same as the exemplary embodiment of FIG. 1, with regard to variation of CPOUT.

FIG. 21 is a diagram showing a configuration of a seventh exemplary embodiment of the present invention by an equivalent circuit. In the configuration of FIG. 21, there is further provided with a circuit B that compensates drain-to-source voltages of NFETs E22 and E28 that are cascode-connected between an NFET E23 and a resistor R22, with regard to the configuration of FIG. 19. The circuit B includes a common-gate NFET E30. That is, the NFET E30 has a source, which forms an input, connected to one end of the resistor R22, a drain, which forms an output, connected to a source of the NFET E23, and a gate supplied with a fixed potential (bias voltage VA). When current flowing in the NFET E23 and the resistor R22 increases, a drain-to-source voltage Vds of the NFET E30 increases, and the drain-to-source voltage Vds of the NFET E22 and the NFET E28 is compensated. In the present exemplary embodiment, an output stage circuit has an identical configuration to FIG. 19. In the present exemplary embodiment also, an operational effect is realized that is the same as the exemplary embodiment of FIG. 1, with regard to variation of CPOUT.

The various disclosures of the abovementioned patent documents are incorporated herein by reference thereto. Modifications and adjustments of embodiments and examples are possible within the bounds of the entire disclosure (including the scope of the claims) of the present invention, and also based on fundamental technological concepts thereof. A wide variety of combinations and selections of various disclosed elements are possible within the scope of the claims of the present invention. That is, the present invention clearly includes every type of transformation and modification that a person skilled in the art can realize according to the entire disclosure including the scope of the claims and technological concepts thereof.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A level shift circuit comprising:
    a first resistor including one end connected to ground;
    a first transistor including a drain and a gate connected to other end of the first resistor, and a source connected to a first power supply;
    a second transistor including a source connected to the first power supply, and a gate connected to the drain and the gate of the first transistor;
    a second resistor including one end connected to a drain of the second transistor;
    a third transistor including a source connected to other end of the second resistor, and a gate connected to an input terminal;
    a first current source connected between a second power supply and a drain of the third transistor; and
    an output stage circuit including a fourth transistor including a gate connected to the drain of the second transistor, the fourth transistor being connected between an output terminal and the first power supply.

2. The level shift circuit according to claim 1, wherein the first current source comprises:
    a fifth transistor including a drain connected to the second power supply; and
    a third resistor connected between a source and a gate of the fifth transistor,
    a connection node of the gate of the fifth transistor and the third resistor being connected to the drain of the third transistor.

3. The level shift circuit according to claim 2, wherein the output stage circuit further comprises a sixth transistor connected between the second power supply and the output terminal.

4. The level shift circuit according to claim 1, wherein the output stage circuit further comprises:
    a second current source including one end connected to the second power supply;
    a sixth transistor including a drain connected to other end of the second current source, a gate connected to the drain of the second transistor, and a source connected to a source of the fourth transistor;
    a first diode connected between the coupled sources of the fourth and the sixth transistors and the first power supply;
    a seventh transistor including a drain connected to the second power supply, and a gate connected to a connection node of the second current source and the sixth transistor; and
    a second diode connected between a source of the seventh transistor and the output terminal.

5. The level shift circuit according to claim 4, wherein the second current source comprises:
    an eighth transistor including a drain connected to the second power supply; and
    a fourth resistor connected between a gate and a source of the eighth transistor, a connection node of the gate of the eighth transistor and the fourth resistor being connected to the drain of the sixth transistor.

6. The level shift circuit according to claim 1, wherein the first constant current source includes a fifth resistor connected between the second power supply and the drain of the third transistor.

7. The level shift circuit according to claim 1, further comprising:
    a ninth transistor arranged between one end of the first resistor and ground, the ninth transistor including a drain connected to ground, a source connected to the one end of the first resistor, and a gate connected to another end of the first resistor; and
    a tenth transistor arranged between the source of the third transistor and the second resistor, the tenth transistor including a drain connected to the source of the third transistor, a source connected to one end of the second resistor, and a gate connected to another end of the second resistor.

8. The level shift circuit according to claim 1, further comprising:
    an eleventh transistor including a drain connected to the source of the first transistor, and a source connected to the first power supply; and
    a twelfth transistor including a drain connected to the source of the second transistor, and a source connected to the first power supply, a gate and the drain of the twelfth transistor being connected together and connected to a gate of the eleventh transistor.

9. The level shift circuit according to claim 1, further comprising
    a thirteenth transistor including a drain connected to the second power supply, and a gate connected to ground,
    one end of the first resistor being connected to a source of the thirteenth transistor instead of being connected to ground.

10. The level shift circuit according to claim 8, further comprising a fourteenth transistor including a gate being grounded,
    wherein the fourteenth transistor is connected between the twelfth transistor and the second transistor that are cascode-connected, and the second power supply,
    wherein the fourteenth transistor is connected in series with the second resistor and the third transistor.

11. The level shift circuit according to claim 10, wherein the drain of the third transistor, is directly connected to the second power supply, instead of being connected to the second power supply via the first current source, and the fourteenth transistor is connected between the second resistor and the third transistor.

12. The level shift circuit according to claim 1, wherein a potential of the first power supply is less than ground potential, and potential of the second power supply is greater than ground potential.

13. The level shift circuit according to claim 12, wherein a potential of the first power supply is a negative potential outputted from a booster circuit.

14. A level shift circuit comprising:
    a first transistor including a drain and a gate connected together;
    a second transistor including a gate connected to the drain and the gate of the first transistor;
    a third transistor including a gate connected to an input terminal, and a drain connected to a second power supply;

a fourth transistor including a gate biased with a fixed potential, and a drain connected to a source of the third transistor;

a fifth transistor including a drain and a gate connected to a source of the second transistor, and a source connected to a first power supply;

a sixth transistor including a drain connected to a source of the first transistor, and a gate connected to the drain and the gate of the fifth transistor, and a source connected to the first power supply;

a first resistor connected between a drain of the first transistor and ground;

a second resistor connected between a drain of the second transistor, and a source of the fourth transistor; and an output stage transistor including a drain connected to an output terminal, a source connected to the first power supply, and a gate connected to a drain of the second transistor.

* * * * *